United States Patent
Heidebrecht et al.

(10) Patent No.: US 10,194,514 B2
(45) Date of Patent: Jan. 29, 2019

(54) ELECTROSTATIC CHARGE GROUNDING FOR HUMAN MACHINE INTERFACE EQUIPMENT

(71) Applicant: Rockwell Automation Technologies, Inc., Mayfield Heights, OH (US)

(72) Inventors: Thomas L. Heidebrecht, Cambridge, WI (US); John M. Van Hecke, Hartland, WI (US); Michael A. Sutton, Hales Corners, WI (US); Diane E. Golden, West Allis, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 488 days.

(21) Appl. No.: 14/938,085

(22) Filed: Nov. 11, 2015

(65) Prior Publication Data

US 2017/0135188 A1    May 11, 2017

(51) Int. Cl.
| | |
|---|---|
| *H05F 3/00* | (2006.01) |
| *H05F 3/02* | (2006.01) |
| *G06F 3/041* | (2006.01) |
| *G02F 1/1333* | (2006.01) |
| *G06F 1/16* | (2006.01) |
| *G06F 1/18* | (2006.01) |
| *H05K 9/00* | (2006.01) |

(52) U.S. Cl.
CPC .......... *H05F 3/02* (2013.01); *G02F 1/133308* (2013.01); *G06F 1/1637* (2013.01); *G06F 1/1643* (2013.01); *G06F 1/1656* (2013.01); *G06F 1/182* (2013.01); *G06F 3/041* (2013.01); *H05K 9/0067* (2013.01); *G02F 2202/22* (2013.01)

(58) Field of Classification Search
USPC .......................................................... 361/220
See application file for complete search history.

(56) References Cited

U.S. PATENT DOCUMENTS

| | | |
|---|---|---|
| 6,146,753 A | 11/2000 | Niimi et al. |
| 6,536,913 B1 | 3/2003 | Yajima et al. |
| 7,076,089 B2 * | 7/2006 | Brandt ............... G06K 9/00053 382/124 |
| 2005/0052582 A1 | 3/2005 | Mai |
| 2013/0083275 A1 * | 4/2013 | Al ..................... G02F 1/133308 349/106 |

(Continued)

OTHER PUBLICATIONS

Extended European Search Report, European Application No. 16198409.1, dated Mar. 16, 2017, 11 pages.

*Primary Examiner* — Ronald W Leja (57) ABSTRACT

Electrostatic charge grounding is achieved by connecting an outer surface touchscreen conductive coating to a grounded conductor in a graphics terminal using an electrostatic charge routing system that provides a path for electrons that accumulate on the conductive coating to pass through one or more non-conductive elements in the graphics terminal. The grounded conductor can be a bezel made of metal or another conductor, a conductive paint layer applied to a bezel or other graphics terminal element, a metal spline pin or a metal screw. The electron path defined by the electrostatic charge routing system can include conductive and dissipative elements such as metal spline pins, metal screws, conductive epoxy, conducting plastic elements providing a short, closed electron bridge.

20 Claims, 8 Drawing Sheets

(56) References Cited

U.S. PATENT DOCUMENTS

| | | |
|---|---|---|
| 2014/0152943 A1 | 6/2014 | Dorjgotov |
| 2015/0216024 A1* | 7/2015 | Kwong ................ H05K 9/0067 361/220 |
| 2017/0077696 A1* | 3/2017 | Demenschonok ........ G06F 3/02 |
| 2017/0135188 A1* | 5/2017 | Heidebrecht ............. H05F 3/02 |

* cited by examiner

ELECTROSTATIC CHARGE GROUNDING FOR HUMAN MACHINE INTERFACE EQUIPMENT

TECHNICAL FIELD

Aspects of the disclosure are related to the field of electrostatic charge grounding in human machine interface equipment having non-conductive elements.

TECHNICAL BACKGROUND

Equipment enclosures are typically employed to encase electronic and/or electrical components, such as circuit card assemblies, printed circuit boards, discrete electrical components, or other equipment. The equipment enclosures provide protection from the surrounding environment, such as water, dust, dirt, vibration, electrical interference, or other environmental hazards. Also, when electronic equipment is used in human-equipment environments, such as when a human operator must interact with the equipment, electrostatic discharge (ESD) events can occur. ESD events can include static electrical discharges between a human operator or handler of electronic equipment and the equipment itself, among other events. The ESD energy typically follows a path to an electrical ground from the ESD source, such as a finger, clothing, or the device itself.

With regard to touchscreens in human machine interface devices, two basic constructions are available when mounting a touchscreen in a bezel—front loading and rear loading. Rear loading allows the front surface of the touchscreen to be in contact with the rear of the bezel and the seal can be implemented using a conductive adhesive. This method of construction does not present any challenges to existing assembly techniques. It has the disadvantage of introducing a ledge or shelf surrounding the touchscreen that accumulates materials from the environment, and can allow bacteria growth in environments where organics are present in the atmosphere. Front loading provides a flat (coplanar) front surface that does not accumulate material from the environment.

Moreover, ESD events in some environments can lead to explosions (e.g., in industrial settings relating to oil, gas, pharmaceuticals and paints). Standards and safeguards applicable in some areas require safety features and/or characteristics for equipment operated in such environments. For example, in Europe, the Appareils destinés à être utilisés en Atmosphères Explosibles (ATEX) directive comprises two directives describing what equipment and work environment characteristics are allowed in an environment with an explosive atmosphere. ATEX requires that electrical equipment be designed to avoid danger of ignition due to electrostatic charges under normal conditions of use, maintenance and cleaning. This ATEX requirement is satisfied by covering non-metallic surfaces with a bonded durable conductive coating.

One aim of the ATEX directives is to permit sales and operation of ATEX-compliant apparatus and systems within the EU without requiring separate testing and other formalities for each jurisdiction. Generally the ATEX equipment and protective systems directive applies whenever equipment has its own ignition source, is intended for operation in a potentially explosive atmosphere, and operates under normal atmospheric conditions. Electrostatic discharge is recognized by the ATEX directives as an effective ignition source.

OVERVIEW

Electrostatic charge grounding of the outer surface of an human machine interface (HMI) device (e.g., a display such as a touchscreen assembly in a graphics terminal) is achieved by connecting an outer surface conductive coating to a grounded conductor in the HMI device. The connection is made using an electrostatic charge routing system that provides a path for electrons that accumulate on the outer surface conductive coating to reach ground—this can be done by routing electrons through one or more non-conductive elements in the HMI device, by routing electrons "around" the non-conductive element(s) via a contiguous conductive path and in other ways, including combinations of these various routing modes. The grounded conductor can be a bezel made of metal or another conductor, a conductive paint layer applied to a bezel or other HMI device element, a spline pin or a screw. The electron path defined by the electrostatic charge routing system can include conductive and dissipative elements such as metal spline pins, metal screws, dissipative plastic functioning as a short, closed electron bridge, and conductive epoxy.

This Overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

TECHNICAL DISCLOSURE

Implementations of electrostatic charge grounding disclosed and claimed herein provide devices and methods pertaining to HMI devices in which electrostatic charge is effectively conducted from an outer conductive coating on non-conductive (e.g., non-metallic) surface (e.g., an overlay that is part of a touchscreen assembly) to a grounded conductor via a electrostatic charge routing system—the electrostatic charge can be routed through one or more non-conductive components such as a non-conductive touchscreen overlay and/or a non-conductive bezel and/or can be routed "around" the non-conductive component(s). The outer conductive coating can be a clear hardcoat affixed or applied to the outer surface of a non-conductive component (e.g., an overlay on a touchscreen). The grounded conductor can be an appropriate element and/or material connected to ground.

Figure 1A:
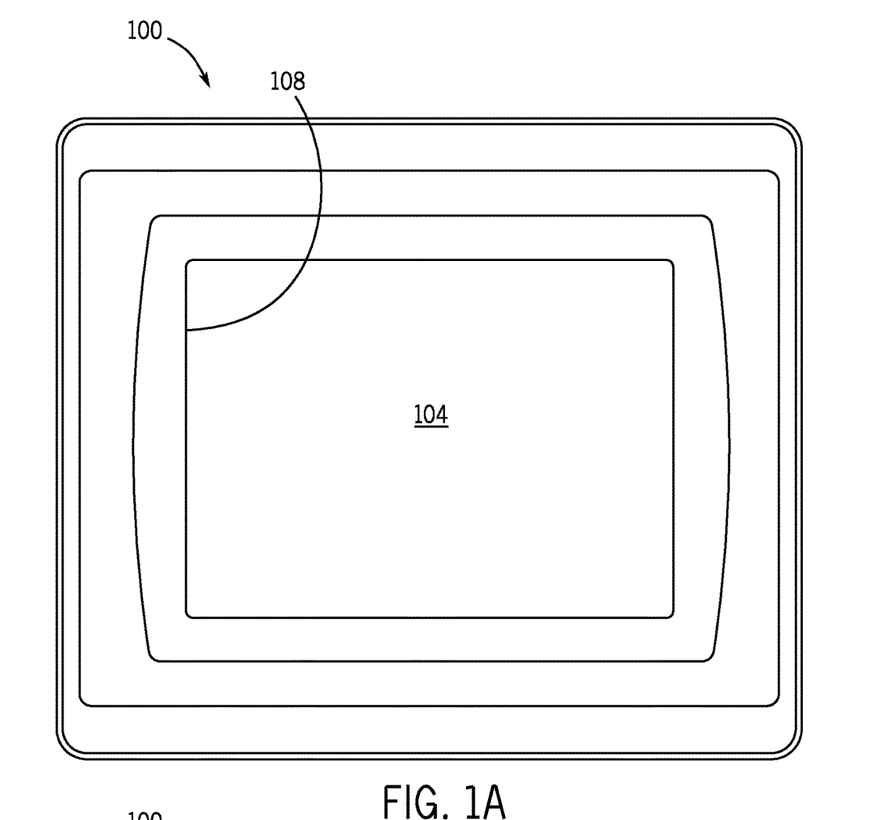
FIG. 1A illustrates a front view of an HMI device.
Figure 1B:
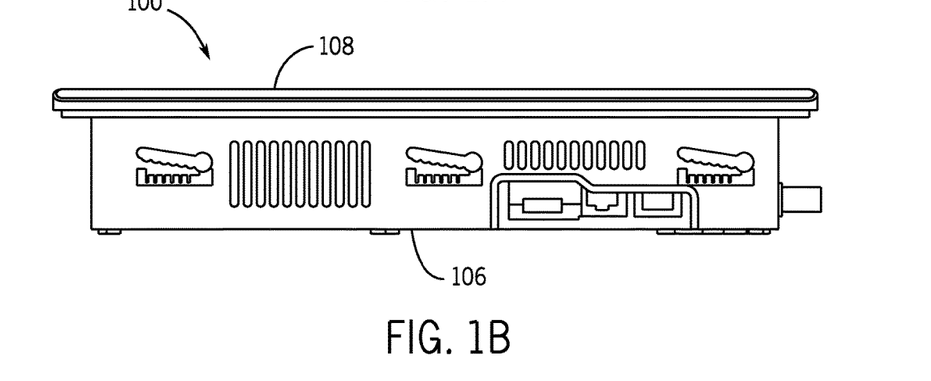
FIG. 1B illustrates a bottom view of an HMI device.

FIGS. 1A and 1B illustrate a representative human machine interface (HMI) device 100 (e.g., a graphics terminal) having a HMI component assembly 104 (e.g., a touchscreen assembly) that is part of an HMI module 106 wherein the HMI component of assembly 104 is framed within a bezel assembly 108. Visualizations on a HMI components like touchscreens can include objects that depict images, text, animation, and the like. Other HMI components can include keypads, segmented character display, informational and instruction labels, etc. In some implementations, assembly 104 can be mounted in a unit separate from an industrial automation device. However, it should be noted that in some implementations assembly 104 can also be disposed within an industrial automation device such as an industrial automation drive, motor starter, contactor, switchgear, energy meter, robot, and the like.

Assembly 104 may be used as an operator interface to control, monitor and/or display various properties associated with the respective industrial automation device or various other components in an industrial automation system or may be used in other ways via interactions between assembly 104 and an operator. Whether mounted within or remote from an industrial automation device or the like, various human interface devices utilize HMI components that can be located in an environment that is hostile to an HMI device and/or that poses dangers when electrical and electronic devices are operated within the environment. To protect such HMI components and any associated input keys, display elements, membrane button elements, etc. from scratches, water, dust, fingerprints and other external damage (e.g., from chemicals, abrasive materials), protective overlays sometimes cover HMI components and gaps in the constructions of the HMI device. Such overlays typically are insulators that allow electric charge build up. A conductive layer (e.g., a conductive clear hardcoat) can be applied to the overlay to provide surface conductivity. However, such conductivity still requires that accumulated electrostatic charge have a path to ground.

A protective overlay or other covering is commonly used to cover the entire surface of a touchscreen, keypad, character display or the like in a human interface device such as a graphics terminal. Such overlays are insulators that do not permit the passage of electrostatic charge from an outer surface through the overlay. Moreover, the outer surface of such a protective overlay does not contact ground or a route to ground (e.g., a bezel to which a touchscreen assembly is mounted), thus electrically isolating any electrostatic charge that accumulates on the protective covering's outer surface.

Figure 2:
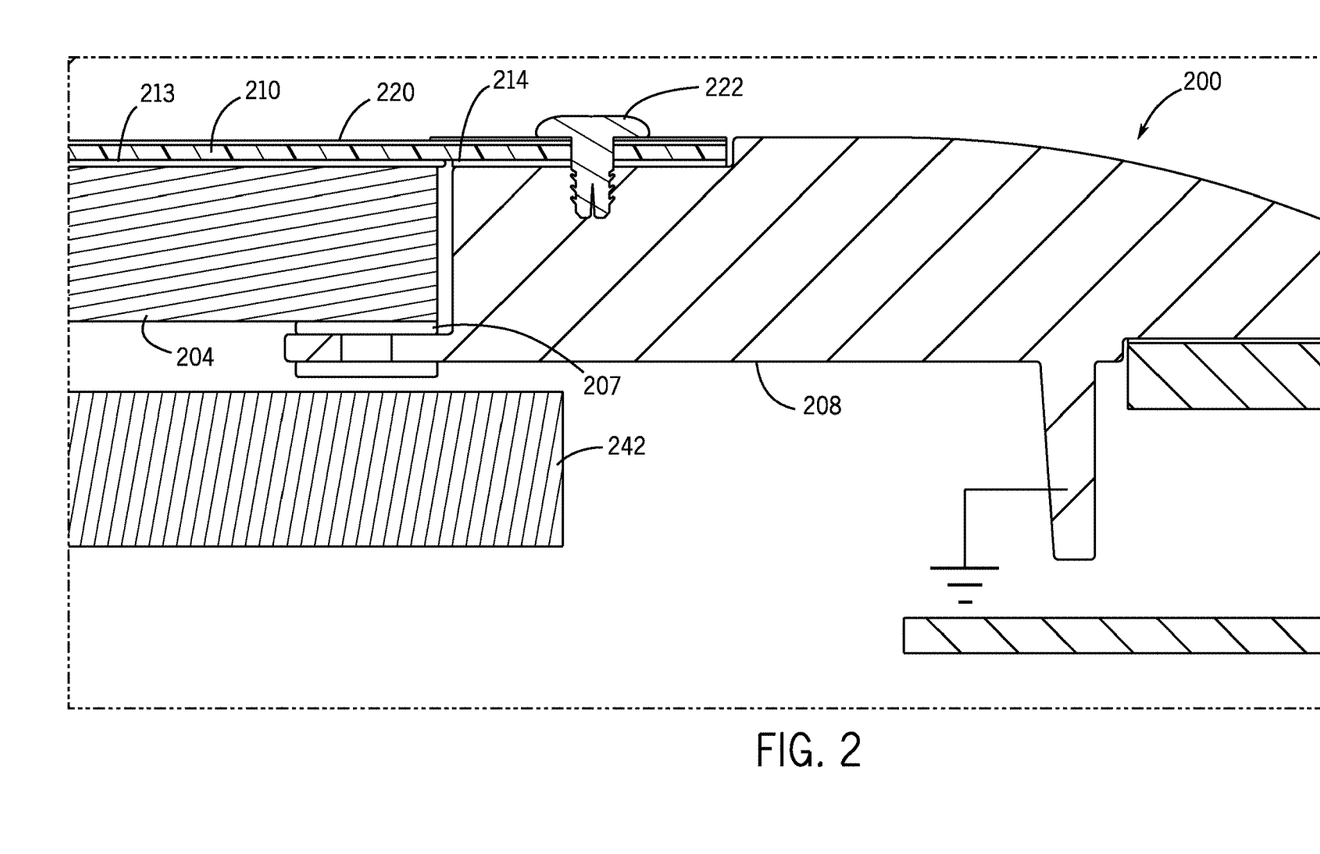
FIG. 2 illustrates a cross-sectional view of an HMI device implementing electrostatic charge grounding.

FIG. 2 illustrates an exemplary implementation of electrostatic charge grounding in a graphics terminal 200 having a touchscreen assembly and a grounded metal bezel 208. The implementations of FIGS. 2-8 are non-limiting examples of electrostatic charge grounding of an HMI device having an HMI component assembly and a ground; the graphics terminal/touchscreen examples are being provided for illustrative purposes. In each of these non-limiting examples, the graphics terminal (i.e., HMI device) includes a touchscreen (i.e., HMI component) having an overlay (i.e., non-metallic or other non-conductive surface) that has a conductive coating (i.e., conductive cover). The touchscreen assembly comprises a touchscreen 204 and a clear plastic overlay 210 (e.g., made of an excellent insulator such as polyethylene terephthalate (PET), in some cases having a width of approximately 0.7 mm), which covers the touchscreen 204 and can be affixed to touchscreen 204 and metal bezel 208 using adhesive layers 213, 214, respectively, or the like. Adhesive in layer 214, which can be an optically clear adhesive, affixes the inner surface of non-conductive overlay 210 to an outer surface of touchscreen 204. Adhesive layers 213, 214 may use the same adhesive or may use different adhesives. Other mounting means 207 can be used in addition to or instead of adhesive to mount touchscreen 204 to and/or adjacent to metal bezel 208. The touchscreen assembly can also include a liquid crystal display (LCD) unit 242. A conductive coating 220 enables electron mobility and covers the outer surface of non-conductive overlay 210. The inner surface of conductive coating 220 is affixed to (e.g., applied to) the outer surface of non-conductive overlay 210 and the outer surface of conductive coating 220, despite allowing electron mobility, lets electrostatic charge accumulate if conduit 222 is absent.

Figure 3:
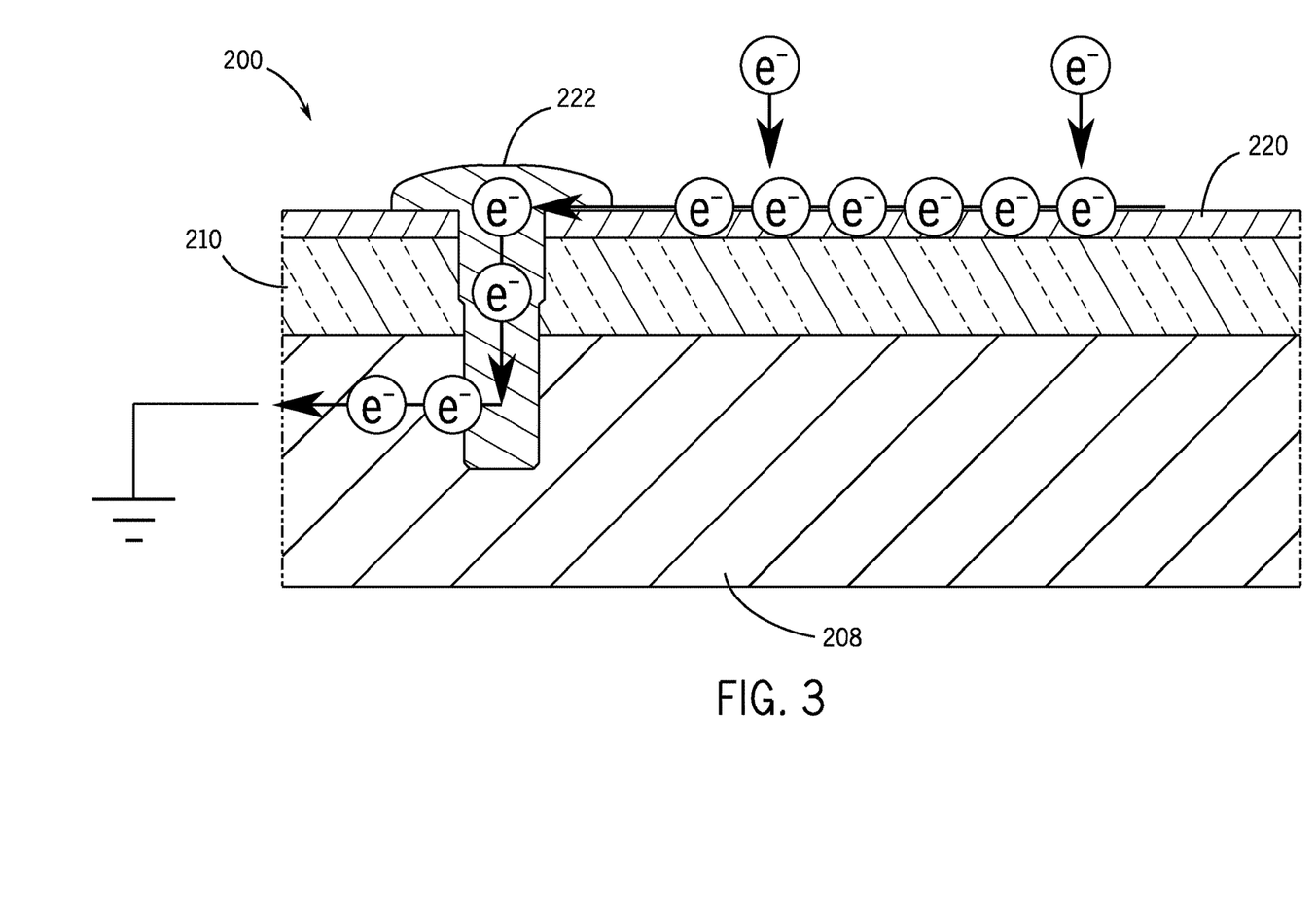
FIG. 3 illustrates a cross-sectional view of an HMI device implementing electrostatic charge grounding.

In these implementations the electrostatic charge routing system include one or more electrostatic charge routing conduits 222 that electrically connect conductive coating 220 to grounded metal bezel 208 (a grounded conductor), thus providing an exit path for electrostatic charge accumulated on conductive coating 220 to find its way to ground passing through non-conductive overlay 210. As seen in FIG. 3, electrons that accumulate on conductive coating 220 can use conduit 222 to pass through non-conductive overlay 210 to the grounded metal bezel 208. As can be seen in FIG. 2, but for conduit 222, there would be no conductive path through overlay 210 and electrostatic charge accumulated on conductive coating 220 would therefore be electrically isolated from both metal bezel 208 and any other pathway for grounding of such accumulated electrostatic charge.

Conduit 222 can be implemented in a variety of ways, for example as a post, screw, pin, rivet, spline pin or other elongate conductor that conducts charge from the surface of a conductive substrate such as a conductive hardcoat covering an overlay, through the overlay to an inner conductive substrate (e.g., a grounded conductor such as bezel 208). A spline pin or screw provides a simple, easily constructed implementation that provides good surface area contact with both the outer surface of the conductive coating (via the underside of the pin/screw head engaging the top of the conductive surface substrate) and the inner grounded conductor (via the threaded or splined body embedded in and engaging the underlying grounded conductor).

Conduit 222 can be made of any suitable material (e.g., stainless steel that avoids corrosion, and thus high impedance). These implementations capture surface conductivity economically and robustly and avoid the costs and risks of retooling required in connection with some alternatives (e.g., rear loading). Moreover, these implementations utilize a reliable touchscreen assembly and related overlay apparatus to provide products that meet ATEX standards and certifications. This is an inexpensive way to make a display product that can meet ATEX certification requirements using a plastic touchscreen overlay with conductivity to avoid static buildup, while providing a seamless and coplanar front solution, using an established high volume bezel construction to keep cost low.

In some graphics terminals and other HMI devices the bezel or a similar component is composed of non-conductive material. In other cases, the bezel can be made of conductive plastic that, when molded or otherwise processed, does not possess sufficient surface conductivity to dissipate or adequately transmit accumulated electrostatic charge. With regard to bezels cast from conducting plastics, the surface conductivity of such bezels is often far below useful levels, which is especially problematic with regard to anti-static considerations. In such cases a conductive paint system can be implemented to provide better electrostatic charge mobility at the surface.

In some implementations, in order to provide both a painted plastic bezel that is both sufficiently conductive and sufficiently durable, a less conductive (but more durable) exterior paint is applied over a more conductive (but less durable) paint. The volume conductivity of the outer paint allows for a short (paint-thickness) path to the much more conductive inner paint, providing sufficient conductivity for submission of a plastic bezel for ATEX ratings and the like, while maintaining exterior durability to preserve the conductivity despite expected end-user wear and tear. Such implementations allow the practical use of a cost-effective plastic bezel construction (rather than metal or expensive but inferior "conducting plastics") that will meet the stringent anti-static requirements. These implementations also permit lower priced products to meet static dissipation specifications.

Figure 4A:
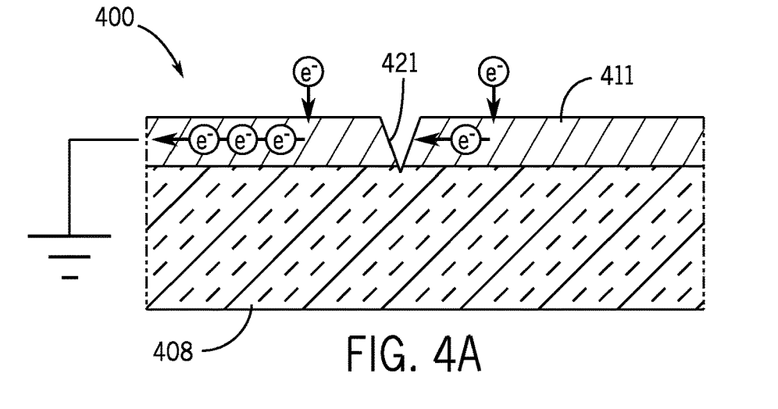
FIG. 4A illustrates a cross-sectional view of an HMI device employing high-conductivity paint.
Figure 4B:
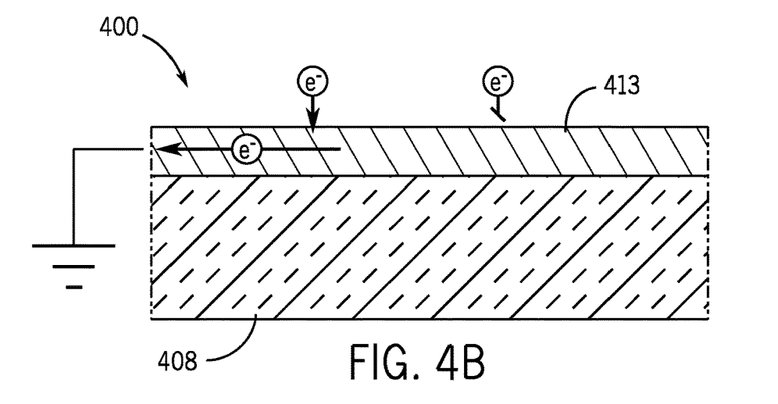
FIG. 4B illustrates a cross-sectional view of an HMI device employing low-conductivity paint.
Figure 4C:
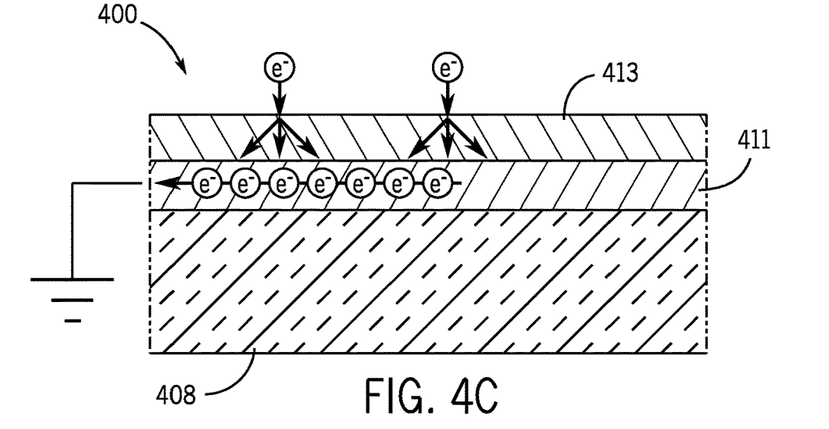
FIG. 4C illustrates a cross-sectional view of an HMI device employing a combination of high-conductivity paint and low-conductivity paint.

FIGS. 4A, 4B and 4C illustrate how a combination of paints can be used in tandem to achieve both sufficient durability and sufficient electrostatic charge dissipation. FIG. 4A illustrates the use of a grounded highly conductive paint layer 411 on a non-conductive element 408 (e.g., a bezel) of a graphics terminal 400. Typically such paints are highly conductive but not sufficiently durable, being easily scratched or otherwise damaged to the point that discontinuities 421 can form in the conductive surface. More durable paints are available, though they suffer from nominal volume conductivity. Such a low-conductivity, durable paint layer 413 applied to an underlying non-conductive element 408 is shown in FIG. 4B. This configuration suffers from the fact that the low-conductivity paint layer 413 cannot channel electrons to ground with sufficient efficacy to reduce the risk of electrostatic charge that accumulates on the surface.

A combination application of the two types of paints is shown in FIG. 4C wherein layering the more durable paint layer 413 over the less durable paint layer 411 on the outer surface provides a durable coating. Because the high durability paint has some nominal conductivity, electrons can pass through that top layer 413 to the underlying highly conductive inner paint layer 411, which provides a path to ground for electrons that would otherwise accumulate on the surface of device 400. When the durable paint layer 413 is applied, electrons can penetrate layer 413 to get to the conductive paint layer 411, thus enhancing conductivity at the surface.

Use of these combination paint layer implementations provides required electrostatic charge routing performance at a substantially lower cost than other charge routing alternatives. Such implementations likewise save on the cost of casting metal bezels and also the cost of retooling for conductive plastics, which can suffer from drawbacks in addition to those specifically mentioned herein.

Other implementations of electrostatic charge grounding provide a path for electrons to flow through one or more non-conductive elements using an electrostatic charge routing system electrically connecting a conductive coating on the outer surface of a touchscreen assembly to a grounded conductor, where the grounded conductor comprises a conductive paint layer covering all or a portion of a non-conductive element.

Unlike implementations in which a conductive bezel is available, good contact is made between the conductive conduit and one or more additional conductors affixed to an underlying non-conductive element. A conductive paint or other coating can be applied to the outer surface of the underlying non-conductive element, allowing the non-conductive overlay to be affixed to such paint.

Figure 5:
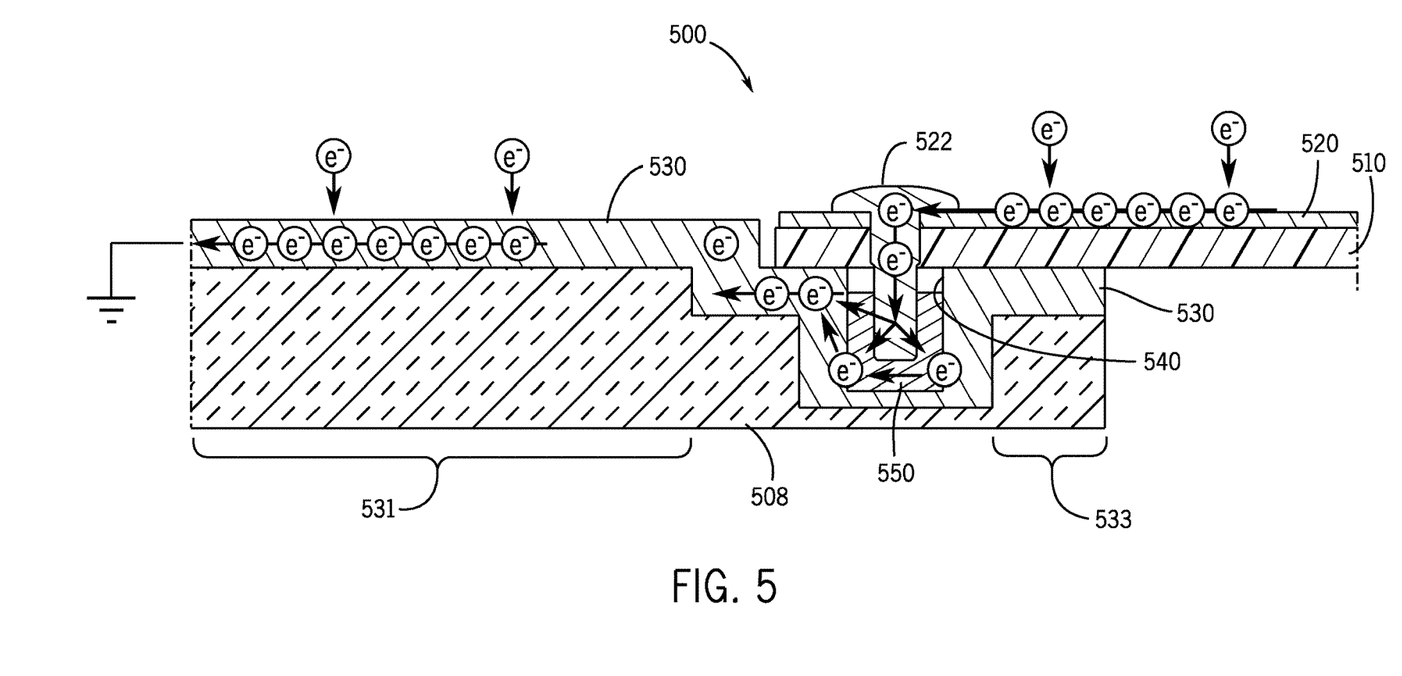
FIG. 5 illustrates a cross-sectional view of an HMI device implementing electrostatic charge grounding.

FIG. 5 shows a graphics terminal 500 comprising a non-conductive bezel 508 made of molded plastic or the like to which a grounded conductive paint layer 530 has been applied. Conductive paint layer 530 is a grounded conductor that includes the normally exposed surface area 531 of the non-conductive bezel as well as the area(s) 533 to which the non-conductive overlay 510 is affixed. A conductive coating 520 covers the outer surface of overlay 510, while the inner surface of non-conductive overlay 510 is affixed to a touchscreen as part of a touchscreen assembly. The electrostatic charge routing system connecting the conductive coating 520 to the grounded conductor includes a conductive conduit 522 is affixed to penetrate the non-conductive overlay 510 while electrically connected to the conductive coating 520 (e.g., via the underside of the head of the conduit, which can be a pin, screw, spline pin or other conductor, as seen in the implementation of FIG. 5). If conductive conduit 522 were to be screwed or otherwise anchored directly into conductive paint layer 530, damage to and/or degradation of the conductive paint layer 530 (e.g., from scratching, tearing, boring) could result in broken continuity between the conductive coating 520 and the grounded conductive paint layer 530, even if a bore or spline hole location was filled with additional conductive paint. The challenge is to ensure that conductive conduit 532 has a substantial electrical connection with the conductive paint layer 530 while not damaging the conductive paint layer 530 to the point where conductivity is materially degraded.

In the one or more implementations shown in FIG. 5, the interior surface of a spline pin hole 540 has been painted with conductive paint (generally matching the conductive paint layer 530) and then filled with conductive epoxy 550. A spline pin, screw or other conductive conduit can be inserted through the conductive coating 520 and non-conductive overlay 510 into the conductive epoxy 550, then cured so that conductive conduit 532 electrically connects conductive coating 520 and conductive epoxy 550. This eliminates scratching, tearing or other damage to the conductive paint. Moreover, there is large surface area electrical contact between the conductive conduit 522 and conductive epoxy 550, as well as between the conductive epoxy 550 and conductive paint layer 530. Because the epoxy is completely contained within this structure, it is not exposed to the outside environment. Thus the conducting fill material can be chosen from a variety of substances.

As with other implementations of electrostatic charge grounding, implementations utilizing conductive epoxy as part of the electrostatic charge routing system in the electrostatic charge grounding system capture the benefits of surface conductivity economically and robustly. These implementations further permit the use of standard non-conductive overlays and low cost molded plastic bezels, and avoid the need for conductive plastics by utilizing conductive epoxy while still providing substantial surface area between conductive materials to provide appropriate electrostatic charge grounding.

Figure 6:
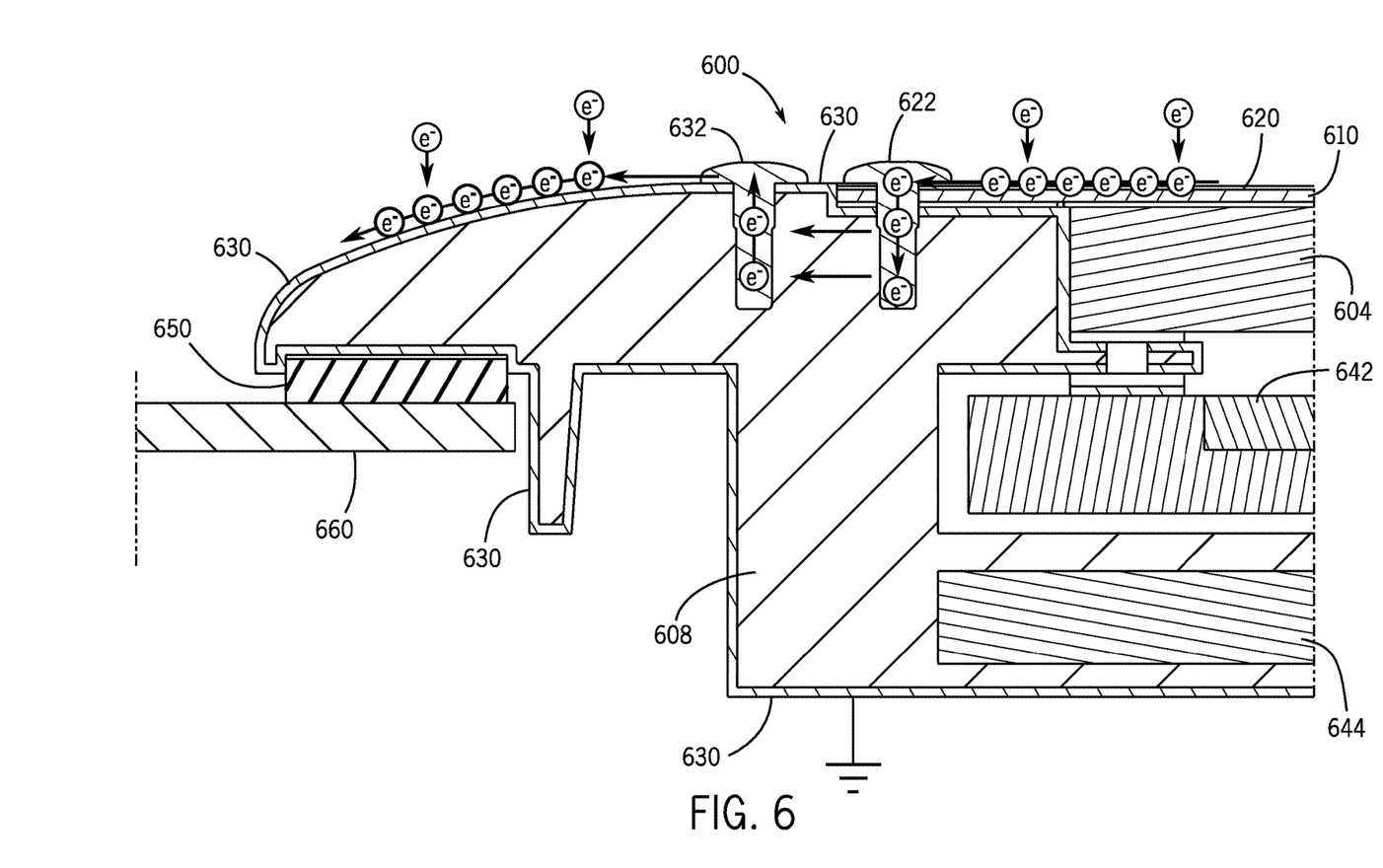
FIG. 6 illustrates a cross-sectional view of an HMI device implementing electrostatic charge grounding.
Figure 7:
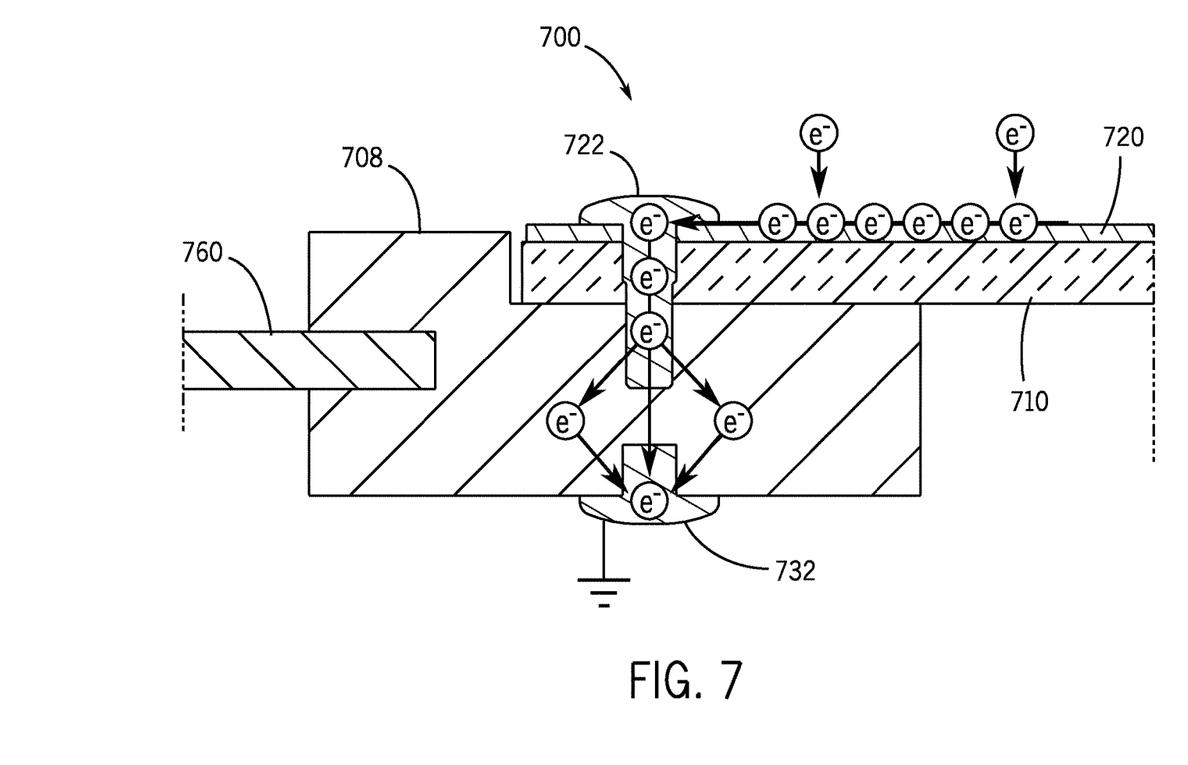
FIG. 7 illustrates a cross-sectional view of an HMI device implementing electrostatic charge grounding.
Figure 8:
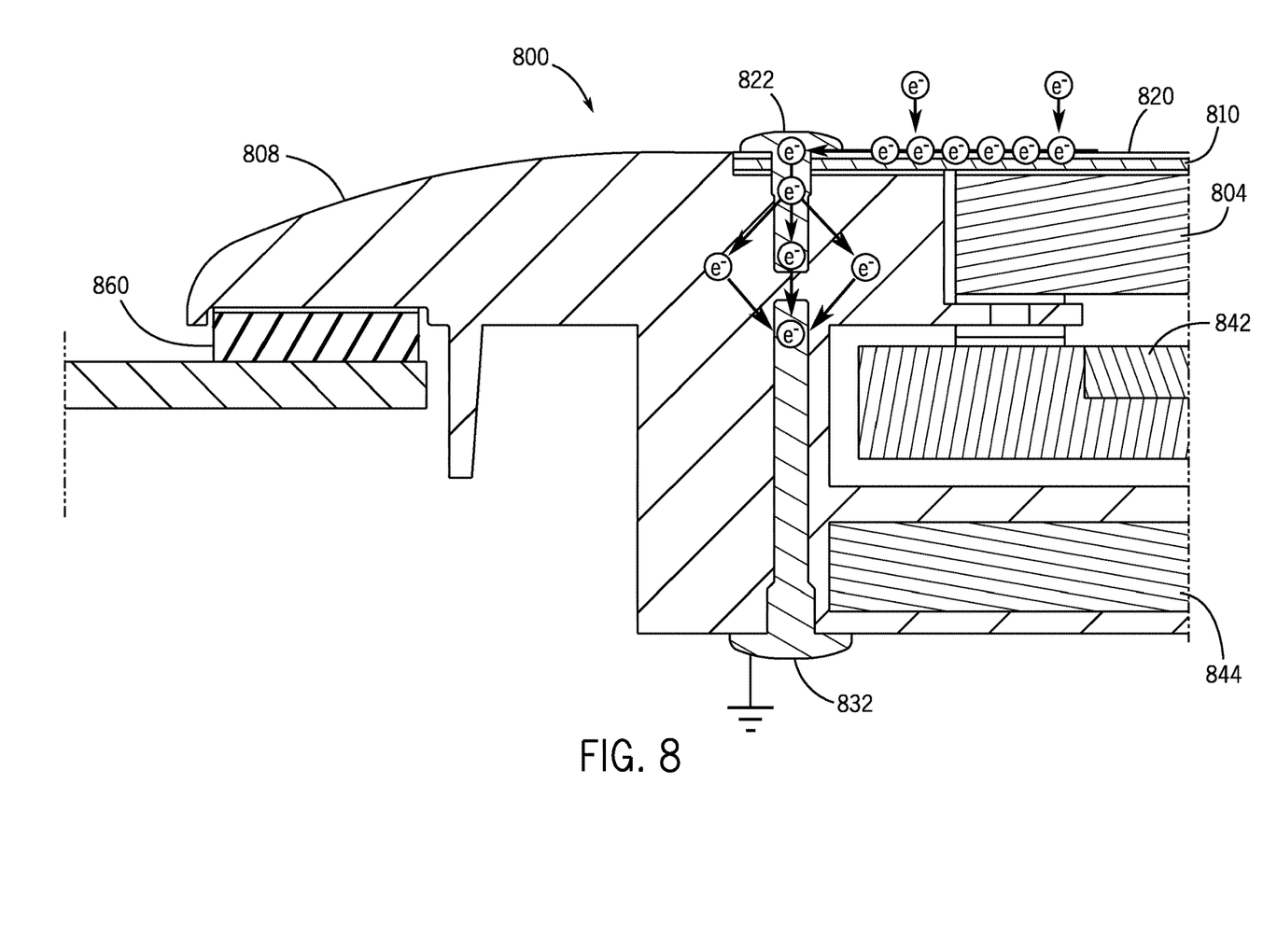
FIG. 8 illustrates a cross-sectional view of an HMI device implementing electrostatic charge grounding.

When a plastic or other non-metal bezel is a static or charge dissipative material ("dissipative"), other implementations of electrostatic charge grounding can be utilized, non-limiting examples of which are shown in FIGS. 6, 7 and 8. In these implementations multiple conductive conduits can be employed as part of the electrostatic charge routing system connecting a conductive touchscreen assembly coating to a grounded conductor, while using the dissipative non-metal substrate as an electron bridge between the conductive conduits. Some of these implementations can be used to provide a path from a surface-conductive plastic overlay on a plastic bezel to the ground pin of a sealed unit meeting requirements under the National Electrical Manufacturers Association and the International Electrotechnical Commission's Ingress Protection standards (NEMA/IP) without losing a continuous path for the elections and without breaching the water/dust sealing capability.

Conductively doped molded plastics suffer reduced conductivity at the molded surfaces due to the dopants' tendency to not stay at the outer surfaces. Some implementations of electrostatic charge grounding use conductive conduits (e.g., spline pins) set into drilled holes to provide access to the relatively higher conductivity of the interior. This allows for effectively using two conductive conduits (e.g., spline pins) that define a conductive plastic bridge to carry electrons from a surface-conductive layer like the conductive coating through an NEMA/IP sealed device to a conductive layer on the back of the graphics terminal, while leaving the conductive plastic bridge effectively "sealed" in the middle (and not physically tunneled through completely)—this naturally preserves a NEMA/IP rating or the like. This also can be used to conduct two adjacent, coplanar surface-conductive parts of a graphics terminal to each other (such as an overlay and a conductively painted area), allowing both conductivity and high NEMA/IP integrity in a plastic product. Such implementations permit fulfillment of ATEX requirements for conductivity in a plastic configuration and can bring a high value ATEX rating to a lower cost product. Any ATEX-qualified product with NEMA and/or IP requirements that would benefit from cost reductions to plastic construction benefit from these implementations.

In FIG. 6 a graphics terminal 600 comprises a touchscreen assembly having a touchscreen 604 and a non-conductive overlay 610 covering touchscreen 604. A conductive coating 620 covers overlay 610. Absent the electrostatic charge routing system (here, one or more conductive conduits), the conductive coating 620 on the non-conductive overlay 610 would be electrically isolated from the conductive non-metallic, dissipative bezel material, so no effective link for electrostatic charge grounding would be present.

The touchscreen assembly is mounted to a non-metallic, dissipative bezel 608. Bezel 608 has a grounded layer of conductive paint 630 covering a substantial portion or all of bezel 608 (e.g., a multiple-layer paint implementation as disclosed herein). As noted above non-conductive overlay 610 protects touchscreen 604 from damage and is covered by a conductive coating 620. In these types of implementations the electrostatic charge routing system includes a first conductive conduit 622 that penetrates both conductive coating 620 and non-conductive overlay 610, being anchored within bezel 608. A second conductive conduit 632 penetrates conductive paint layer 630 and also is anchored in bezel 608. The spacing of conductive conduits 622, 632 anchored within bezel 608 is close enough to permit the material making up bezel 608 to act "laterally" as an electron bridge between the embedded posts of conduits 622, 632. This allows electrons accumulating on both the conductive coating 620 and the external conductive paint layer 630 to collect and migrate to a ground inside an electrical cabinet 660 or the like as defined by a seal 650 that keeps water, dust, contaminants, etc. outside graphics terminal 600, which can also include a liquid crystal display (LCD) assembly 642 and logic module 644.

Other implementations of electrostatic charge grounding can utilize an electrostatic charge routing system employing multiple conductive conduits. In the non-limiting example of FIG. 7, a graphics terminal 700 includes an HMI comprising a touchscreen (not shown) mounted to a non-metallic, conductive bezel 708 that has a seal 760 (e.g., a NEMA/IP water/dust seal) preventing water, dust, etc. from entering a sterile zone within an electrical cabinet. A non-conductive overlay 710 protects the touchscreen from damage and is covered by a conductive coating 720. A first conductive conduit 722 penetrates both conductive coating 720 and non-conductive overlay 710, being anchored within bezel 708. A grounded second conductive conduit 732 also is anchored in bezel 708, but is mounted in an opposing position ("vertically" in FIG. 7) relative to the first conductive conduit 722, thus permitting the ground to be located inside the relatively more sterile environment within the cabinet. The "vertical" spacing of conductive conduits 722, 732 anchored within bezel 708 is close enough to permit the material making up bezel 708 again to act as a small but closed electron bridge between conduits 722, 732. Implementations of this type allow electrons accumulating on both the conductive coating 720 to migrate to the grounded conductive conduit 732 through the electron bridge without substantial dependence on the conductive plastic of bezel 708.

FIG. 8 illustrates a similar implementation of a graphics terminal 800 having a touchscreen 804 mounted to a conductive, non-metallic bezel 808. Again, a non-conductive overlay 810 protects touchscreen 804 and is covered by a conductive coating 820. An LCD assembly 842 and logic module 844 again are included in device 800. Due to a greater thickness of bezel 808, one or both of the conductive conduits 822, 832 in the electrostatic charge routing system can be longer so that and appropriate spacing is established to allow the conductive non-metallic material of bezel 808 to act as a small but closed electron bridge through which electrons can pass from external surface conduit 822 to grounded internal conduit 832.

The various implementations render a technical effect by providing electrical equipment that avoids danger of ignition due to electrostatic charges under normal conditions of use, maintenance and cleaning by grounding a conductive coating covering non-metallic surfaces of the electrical equipment. Such grounding improves the safety of such electrical equipment.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A human machine interface (HMI) device comprising:
an HMI component assembly;
a non-conductive bezel having at least one mounting hole; and
an electrostatic charge grounding system;
wherein the HMI component assembly comprises an HMI component having an outer surface and a non-conductive overlay having an outer surface and an inner surface, the overlay inner surface affixed to the HMI component outer surface;
wherein the electrostatic charge grounding system comprises:
　a conductive coating covering the non-conductive overlay outer surface;
　a grounded conductor, wherein the grounded conductor comprises a conductive paint layer covering the non-conductive bezel and the mounting hole; and
　an electrostatic charge routing system electrically connecting the conductive coating to the grounded conductor through the non-conductive overlay, and wherein the electrostatic charge routing system include a conductive epoxy filling at least a portion of the mounting hole, and a conductive conduit electrically connecting the conductive coating to the conductive epoxy.

2. The HMI device of claim 1 wherein the grounded conductor comprises bezel to which the HMI component assembly is mounted and further wherein the electrostatic charge routing system comprises conductive conduit connecting the conductive coating to the bezel.

3. The HMI device of claim 2 wherein the conductive conduit comprises one of the following: a metal screw or a metal spline pin.

4. The HMI device of claim 1 wherein the conductive conduit comprises one of the following: a metal screw, and a metal spline pin.

5. The HMI device of claim 1 wherein the electrostatic charge routing system comprises the conductive conduit, which comprises a first conductive conduit connecting the conductive coating to the non-conductive bezel; and
　wherein the grounded conductor comprises a second conductive conduit connected to the non-conductive bezel at a position configured to permit electron transmission between the first and second conductive conduits.

6. The HMI device of claim 5 wherein the first conductive conduit comprises one of the following: a metal screw, a metal spline pin; and
　further wherein the second conductive conduit comprises one of the following: a metal screw or a metal spline pin.

7. The HMI device of claim 5 wherein the first conductive conduit and conductive coating are exposed to a first environment and further wherein the second conductive conduit is exposed to a second environment, the first and second environment being separated by a seal that engages the HMI device.

8. The HMI device of claim 1 wherein the HMI component is one of the following: a touchscreen, a keypad, an information label, a character display, or an instruction label.

9. The HMI device of claim 1 wherein the non-conductive bezel comprises molded plastic.

10. An HMI device comprising:
a touchscreen assembly; and
an electrostatic charge grounding system;
wherein the touchscreen assembly comprises a touchscreen and a non-conductive overlay affixed to and covering an outer surface of the touchscreen;
wherein the electrostatic charge grounding system comprises:
　a conductive coating covering the non-conductive overlay, wherein the conductive coating is configured to be exposed to a first environment;
　a grounded conductor, wherein the ground is configured to be exposed to a second environment, wherein the first environment and the second environment are separated by a seal engaging the HMI device; and
　an electrostatic charge routing system electrically connecting the conductive coating to the grounded conductor;
wherein the electrostatic charge routing system comprises a first conductive conduit configured to be exposed to the first environment and connecting the conductive coating to a dissipative bezel; and
wherein the grounded conductor comprises a second conductive conduit configured to be exposed to the first environment and connected to the dissipative bezel at a position configured to permit electron transmission between the first and second conductive conduits.

11. The HMI device of claim 10 wherein the grounded conductor comprises a metal bezel to which the touchscreen assembly is mounted;
further wherein the electrostatic charge routing system comprises the first conductive conduit connecting the conductive coating to the metal bezel, wherein the first conductive conduit comprises one of the following: a metal screw or a metal spline pin; and
further wherein the metal bezel engages the seal that separates the first environment from the second environment.

12. The HMI device of claim 10
wherein the grounded conductor comprises a conductive paint layer covering the dissipative bezel, wherein the conductive paint layer is configured to be connected to ground in the second environment; and
　the first conductive conduit comprising one of the following: a metal screw or a metal spline pin; and
　wherein the second conductive conduit connecting the dissipative bezel to the conductive paint layer, the second conductive conduit comprising one of the following: a metal screw or a metal spline pin.

13. The HMI device of claim 12 wherein the conductive paint layer includes surface area in the first and second environments.

14. The HMI device of claim 10 wherein the first conductive conduit comprises one of the following: a metal screw or a metal spline pin; and
further wherein the second conductive conduit comprises one of the following: a metal screw or a metal spline pin.

15. A human machine interface (HMI) device comprising:
an HMI component assembly;
a dissipative bezel; and
an electrostatic charge grounding system;
wherein the HMI component assembly comprises an HMI component having an outer surface and a non-conductive overlay having an outer surface and an inner surface, the overlay inner surface affixed to the HMI component outer surface;
wherein the electrostatic charge grounding system comprises:

a conductive coating covering the non-conductive overlay outer surface;

a grounded conductor comprising a conductive paint layer covering the dissipative bezel; and an electrostatic charge routing system electrically connecting the conductive coating to the grounded conductor through the non-conductive overlay, and wherein wherein the electrostatic charge routing system comprises the conductive paint layer, a first conductive conduit connecting the conductive coating to the dissipative bezel, and a second conductive conduit connecting the dissipative bezel to the conductive paint layer at a position configured to permit electron transmission between the first and second conductive conduits.

16. The HMI device of claim 15 wherein the first conductive conduit comprises one of the following: a metal screw, and a metal spline pin; and further wherein the second conductive conduit comprises one of the following: a metal screw or a metal spline pin.

17. The HMI device of claim 15 wherein the dissipative bezel is covered in multiple layers of conductive paint.

18. The HMI device of claim 17 wherein an outer layer of paint has a higher durability than an inner layer of paint and the outer layer provides a nominal conductivity to allow electrons to pass through the outer layer of paint to the conductive inner paint layer underneath.

19. The HMI device of claim 15 wherein the HMI component is one of the following: a touchscreen, a keypad, an information label, a character display, or an instruction label.

20. The HMI device of claim 15 wherein the first conductive conduit and conductive coating are exposed to a first environment and further wherein the second conductive conduit is exposed to a second environment, the first and second environment being separated by a seal that engages the HMI device;

further wherein the conductive paint layer includes surface area in the first and second environments.

* * * * *